United States Patent [19]

Spencer et al.

[11] Patent Number: 5,229,925
[45] Date of Patent: Jul. 20, 1993

[54] MODULAR FRONT PANEL AND ENCLOSURE FOR ELECTRONIC APPARATUS

[75] Inventors: John D. Spencer; John W. Mason, both of Roanoke, Va.

[73] Assignee: Valcom, Inc., Roanoke, Va.

[21] Appl. No.: 733,122

[22] Filed: Jul. 19, 1991

[51] Int. Cl.⁵ .......................... H05K 7/16; H05K 7/14
[52] U.S. Cl. .................... 361/422; 211/41; 235/1 D; 361/340; 361/346; 361/259; 361/380; 361/390; 361/415
[58] Field of Search ............... 211/41; 361/336, 340, 361/344, 346, 358, 359, 380, 390, 391, 415; 364/480; 235/1 D, 30 R

[56] References Cited

U.S. PATENT DOCUMENTS

| | | | |
|---|---|---|---|
| 1,692,064 | 11/1928 | Trogner | 361/336 |
| 1,848,837 | 3/1932 | Powers | 361/340 |
| 1,959,266 | 5/1934 | Finnegan | 361/340 |
| 2,185,562 | 1/1940 | Nielsen | 361/421 |
| 2,538,489 | 1/1951 | Walton | 361/334 |
| 3,904,937 | 9/1975 | Levin | 361/391 |
| 3,960,353 | 6/1976 | Leutwyler | 361/391 |
| 4,080,644 | 3/1978 | Reed et al. | 361/358 |
| 4,685,029 | 8/1987 | Tillman | 361/359 |
| 4,789,774 | 12/1988 | Koch et al. | 235/30 R |
| 4,800,460 | 1/1989 | Yin | 361/391 |
| 4,928,205 | 5/1990 | Duback et al. | 361/346 |
| 4,964,018 | 10/1990 | Mallory et al. | 361/391 |
| 5,001,600 | 3/1991 | Benson | 361/340 |
| 5,001,602 | 3/1991 | Suffi et al. | 361/390 |
| 5,031,791 | 7/1991 | Serio, Jr. | 220/281 |
| 5,097,386 | 3/1992 | Byell et al. | 361/341 |
| 5,127,057 | 6/1992 | Chapman | 364/480 |
| 5,138,525 | 8/1992 | Rodriguez | 361/390 |

FOREIGN PATENT DOCUMENTS

| | | | |
|---|---|---|---|
| 0387657 | 9/1990 | European Pat. Off. | 361/394 |
| 1497774 | 7/1989 | U.S.S.R. | 361/415 |

OTHER PUBLICATIONS

Dipl.-Ing Irmfried Bromme, "The Siemens Microcomputer Module System SMP 80" XII 1977 No. 5.

Primary Examiner—Leo P. Picard
Assistant Examiner—D. Sparks
Attorney, Agent, or Firm—Nies, Kurz, Bergert & Tamburro

[57] ABSTRACT

A housing for electronic apparatus, including an enclosure for housing power supply and amplifier circuits that are common to a number of different functional devices. A replaceable, hinged, modular front panel is provided and carries a control circuit on its inner face and switches, indicators, and control knobs on its outer face. Several front panels can be provided having different control circuits for connection with the power and amplifier circuits in the enclosure to thereby change the function of the device or the types of outputs and control functions that it can provide. The front panel is pivotable relative to the enclosure to permit quick and easy access to the interior of the enclosure for inspection and servicing, as well as ready accessibility to the control circuit that is mounted on the control panel. A metallic channel extends from the back panel to the control panel to provide a shielded wireway for input conductors connected with the control circuit.

9 Claims, 4 Drawing Sheets

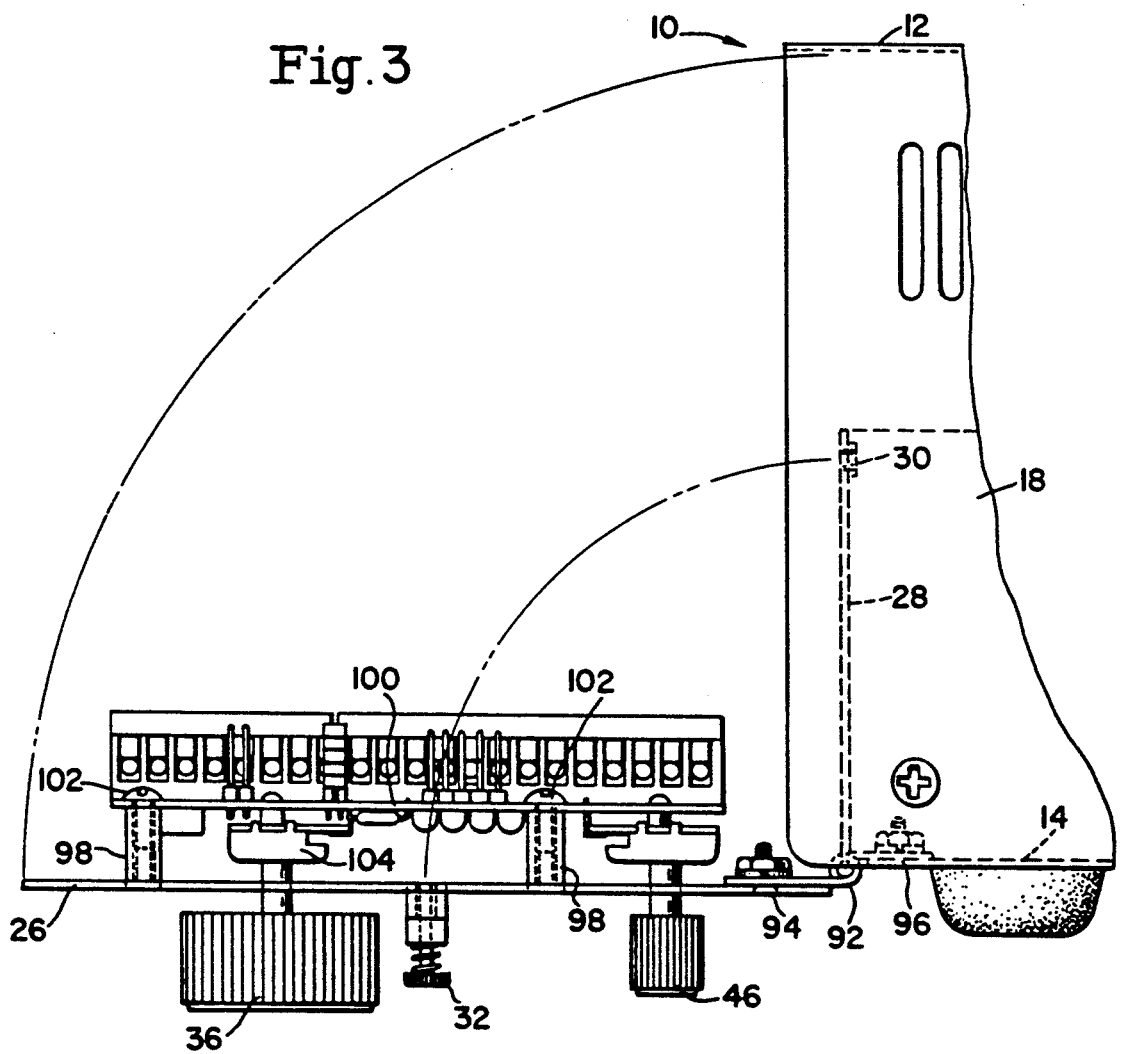

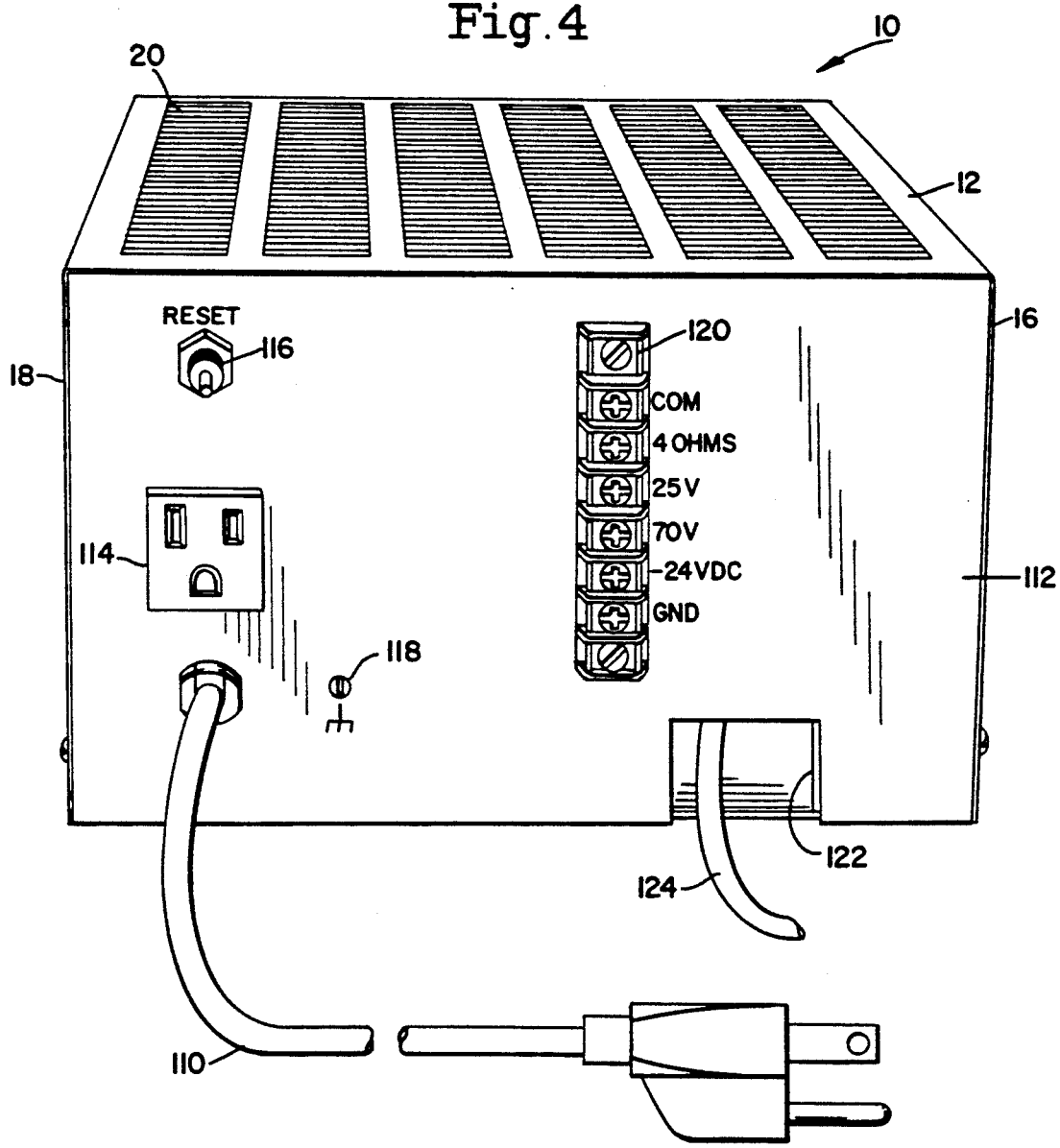

MODULAR FRONT PANEL AND ENCLOSURE FOR ELECTRONIC APPARATUS

BACKGROUND OF THE INVENTION

1. Field of The Invention

The present invention relates to modular enclosures for electronic apparatus for interchanging different circuit elements. More particularly, the present invention relates to an enclosure that houses one type of circuit elements and that includes a pivotable front panel that carries another type of circuit elements. The front panels can be interchanged with other front panels carrying other circuit elements to provide a common enclosure that can be adapted to perform different specific functions, depending upon the front panel and associated front panel circuitry that is provided.

2. Description of The Related Art

Typically, electronic devices are provided in generally rectangular enclosures in which the circuit elements are mounted on a printed circuit board that carries the interconnection wiring between the circuit elements. One or more printed circuit boards are securely positioned within the interior of the enclosure, usually to the base or sides of the enclosure. Sometimes they are carried on a metal chassis that is bolted to the enclosure base. Any switches, control knobs, indicator lights, or the like, are carried on a front panel of the device, so they are accessible to a user, and conductors extend from the front panel devices to the main circuit elements within the interior of the enclosure. The most common of such devices are radios and television sets, although various other types of electronic devices have a generally similar construction.

The above-described approach to housing components of electronic devices renders servicing inconvenient and awkward. Frequently, accessibility to various circuit elements is difficult and oftentimes it is necessary to remove the element or the printed circuit board to which it is connected. Thus, the servicing of such devices is inconvenient and time consuming.

In addition to the servicing aspects, the attachment of circuit elements to circuit boards or chassis that are bolted to the base of the enclosure renders the enclosure essentially a dedicated, single function device. Thus, although a number of different kinds of electronic devices may contain common elements, and therefore may have some circuitry in common, the usual structural arrangement does not permit interchangeability so that the common elements can be retained and different circuit elements quickly and conveniently connected to them so that the enclosure can function as a different electronic component, as needs might dictate.

One approach to providing improved accessibility to circuit elements of an electronic device is disclosed in U.S. Pat. No. 2,185,562, which issued Jan. 2, 1940, to J.F. Nielsen. That patent shows an enclosure having a pivotable front panel that can be pivoted downwardly to expose the rear face of the back panel and the interior of the enclosure. However, the front panel includes a further, outwardly extending enclosure of its own that is pivotally connected with the front panel for housing a plurality of vacuum tubes that are positioned for easy accessibility.

Another example of a hinged front panel arrangement for an electronic device is disclosed in U.S. Pat. No. 1,692,064, which issued Nov. 20, 1928, to A.M. Trogner. The Trogner patent discloses an enclosure that has a pivotable front panel for providing access to the circuitry and permitting inspection and repair of the apparatus. A pair of angular, blade-type contact elements are provided on the interior face of the front panel to maintain contact, after the front panel is pivoted outwardly a predetermined distance, so that the circuits on the front panel continue to receive electrical power after the front panel is opened.

Although pivotable front panels have been disclosed in connection with electronic devices to permit access to circuit elements housed within an enclosure, in each instance the enclosures are intended for but a single use, thereby requiring separate enclosures for different devices, even though not all the different devices would be needed at any one time.

It is therefore an object of the present invention to provide an improved housing for electronic apparatus that permits interchangeability of front panels to enable as single enclosure containing such apparatus to be put to different uses.

It is a further object of the present invention to provide a housing for electronic apparatus in the form of an enclosure in which the front panel of the housing is pivotable and removable.

It is a still further object of the present invention to provide a housing for electronic apparatus wherein an enclosure is provided having circuit elements that are common to a number of different types of apparatus, and replaceable and interchangeable front panels are provided, the front panels having circuit elements that are specific to a particular function and that can be connected with the common circuit elements to permit a single housing to function in a number of different ways to provide a wide variety of electronic devices without the need for separate enclosures for each device.

It is another object of the present invention to provide a housing for electronic apparatus that includes a pivotable front panel that contains circuit elements specific for a particular use, and in which the enclosure houses common circuit elements common to a number of specific circuits, and the housing includes a shielded wire channel extending through the enclosure from the rear panel to the front panel.

SUMMARY OF THE INVENTION

Briefly stated, in accordance with one aspect of the present invention, a housing is provided for electronic apparatus wherein common circuit elements are secured to and carried within an enclosure, and a modular front panel is removably hingedly connected with the enclosure and carries circuit elements that are specific to a particular function. The housing includes a tubular enclosure having at least one open end, and that includes an electrical power supply circuit positioned within the enclosure. A first connector means is provided for electrically connecting the power supply with a source of electric power, and a second connector means is provided for electrically connecting the power supply with a control circuit. A control circuit is mounted on the rear face of a control panel that is removably hingedly connected with the enclosure so that it can readily be pivoted from a first position, exposing the interior of the enclosure, to a second position in which it closes the enclosure.

The control panel has mounted on the inner surface thereof a control circuit that includes at least one of switch means, indicator means, and level control means, and includes control elements that are operable from the front face of the control panel. A metallic wire channel extends interiorly of the enclosure from the front end thereof to the rear panel thereof and defines a shielded channel for receiving input signal conductors that are connectable with the control circuit.

BRIEF DESCRIPTION OF THE DRAWINGS

FIG. 3 is an enlarged, fragmentary side view of the housing of FIG. 1, showing a front panel that has been pivoted to an open position to expose the control circuit and the interior of the housing.

FIG. 4 is a rear view of the housing shown in FIG. 1.

DESCRIPTION OF THE PREFERRED EMBODIMENTS

Figure 1:
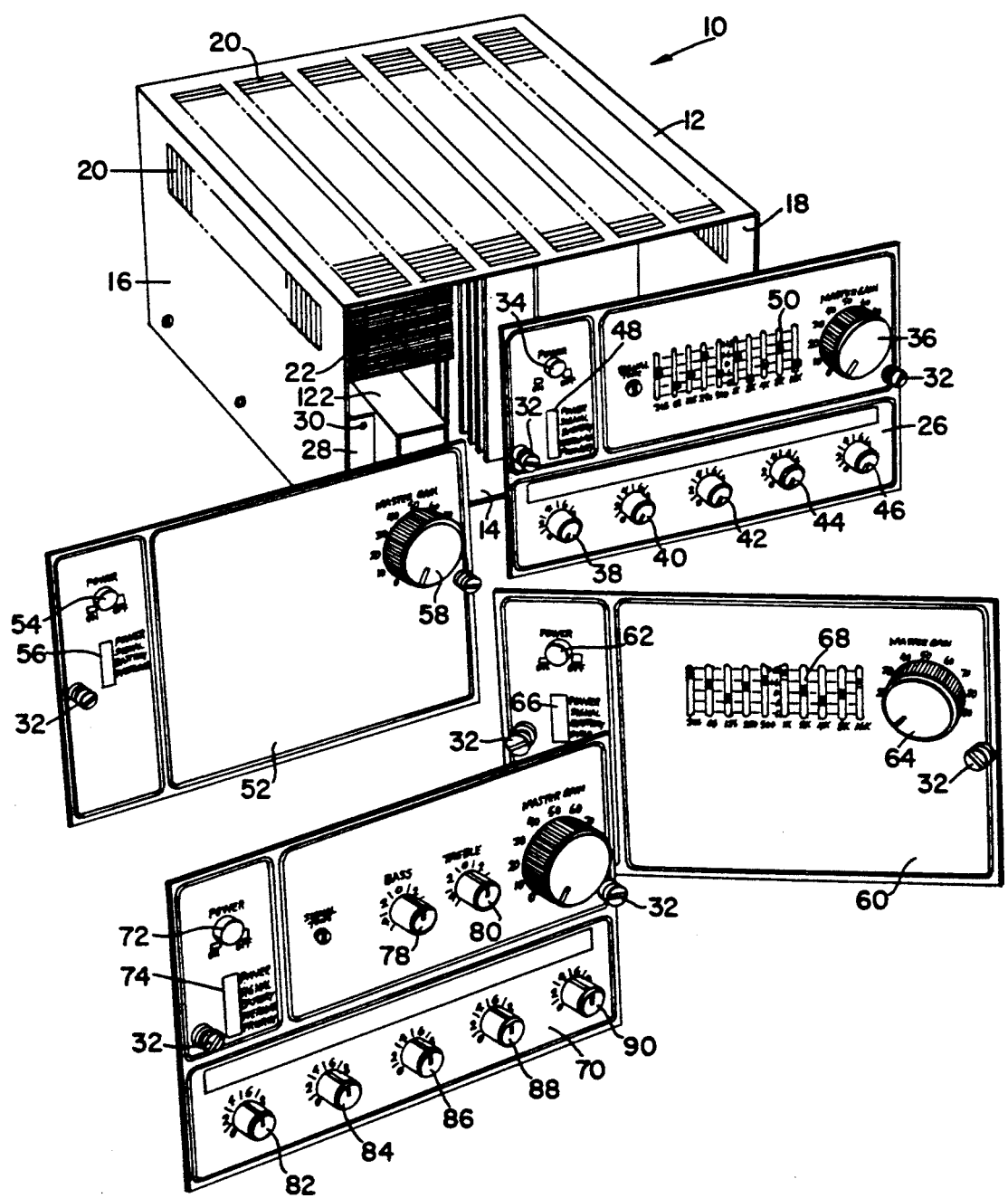
FIG. 1 is a perspective view showing a housing for electronic apparatus in accordance with the present invention, illustrating four different types of front panels that can removably be associated with the housing for different electronic functions.

Referring now the drawings, and particularly to FIG. 1 thereof, there is shown an enclosure 10 of generally rectangular cross section. Enclosure 10 includes a pair of opposed, parallel top and bottom panels, 12, 14, respectively, and a pair of opposed, parallel side panels 16, 18, respectively, to define a generally rectangular housing. Top panel 12 and side panels 16 and 18 can be provided in a unitary structure that is bent from a piece of sheet stock, as will be appreciated by those having skill in the art. Additionally, either side panels 16 and 18 or top panel 12, or each of them, as well as bottom panel 14, can contain a plurality of vent apertures 20, which can be of any desired shape and orientation, to permit ambient air to enter into and to circulate through the interior of enclosure 10 to thereby prevent overheating of the components positioned therewithin.

Housing 10 preferably includes circuit elements that are common for a number of different possible electronic devices. As shown, housing 10 includes a power transformer 22 and amplifier circuit elements 24 that are in themselves common to different types of electronic devices, depending upon the particular additional circuit elements with which the amplifier circuit elements are connected. Power transformer 22 and amplifier circuit elements 24 are preferably secured in position within housing 10 and are recessed inwardly from the front of housing 10 a sufficient distance to permit additional circuit elements that are contained on a front panel 26 to project into the interior of housing 10.

Side panels 16 and 18 each carry adjacent their forwardmost edges a front panel connector flange 28, only one of which is visible in FIG. 1. Connector flange 28 includes a threaded aperture 30 for receiving a connecting screw 32 carried by front panel 26.

Housing 10 shown in FIG. 1 can have connected to it one of several different front panel configurations. Four different types of front panels are illustrated. For example, front panel 26 includes manual control elements in the form of an on-off switch 34, control knobs 36, 38, 40, 42, 44, and 46, an indicator light 48, and a plurality of slide switches 50 that extend through panel 26 to the front surface thereof. The manual control elements, when associated with the proper circuit elements (not shown) collectively permit panel 26 and housing 10 to function, when properly connected with the power and amplifier circuitry within housing 10, as a five input mixer module with equalizer.

Front panel 52 contains an on-off switch 54, a power indicator light 56, and a gain control knob 58 that permit panel 52 and housing 10 to function as a booster and equalizer module.

Front panel 60 contains an on-off switch 62, a gain control knob 64, a power indicator light 66, and slide switches 68 which together with associated circuitry (not shown) carried on its rear face permits panel 60 and housing 10 to function as a booster input module.

Front panel element 70 includes an on-off switch 72, a power indicator light 74, a gain control knob 76, bass and treble control knobs 78, 80 and input level control knobs 82, 84, 8s6, 88, and 90 which together with associated circuitry (not shown) carried on its rear face permits panel 70 and housing 10 to function as a five input mixer module.

Thus, the particular function modules and associated face panels illustrated have in common a manual on-off power switch, a power indicator light, and a master gain control knob. Additionally, each of the front panels illustrated and described includes a pair of captive panel screws 32 that are adapted to be threadedly connected with threaded apertures 30 in inwardly extending front panel connector flanges 28.

Figure 2:
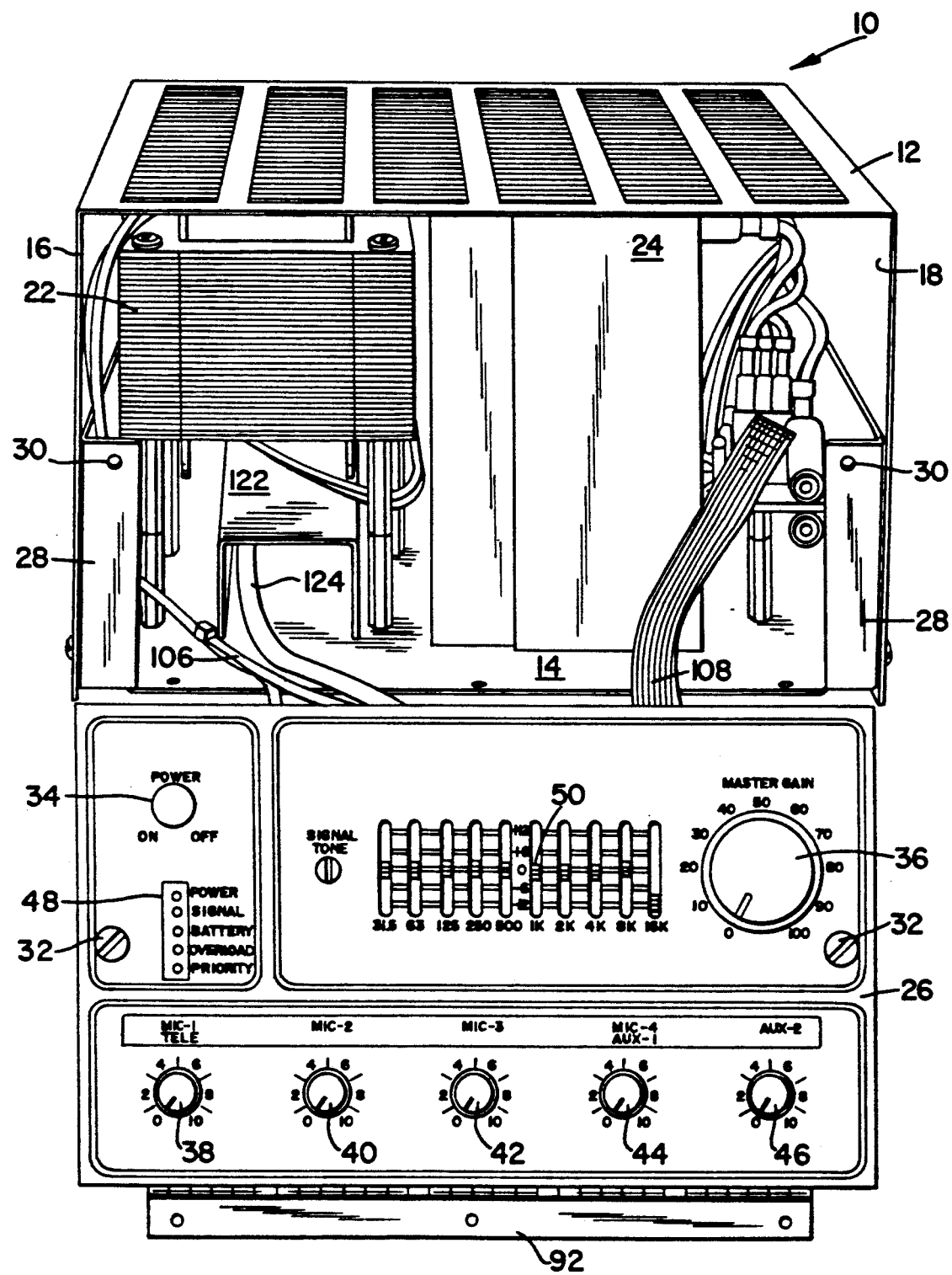
FIG. 2 is a front view of the housing shown in FIG. 1 with one form of front panel shown removed from the housing and showing connectors extending from the front panel to circuit elements within the housing.

The interior of housing 10 and the arrangement for connecting a front panel with components within housing 10 are best seen in FIGS. 2 and 3. As shown, front panel 26 includes a piano-type hinge 92 that is suitably connected to the lower edge thereof, as by means of bolts 94 (see FIG. 3) and to bottom panel 14 of housing 10 by means of bolts 96. Front panel 26 can therefore pivot about the pivot axis of hinge 92 from a first position at which the front panel overlies the front of housing 10, to a second position (as shown in FIG. 3) at which front panel 26 is pivoted outwardly from housing 10 to expose the interior of housing 10 and to permit access to the several circuit elements that are mounted on the rear face of front panel 26.

As shown in FIG. 3, a number of threaded standoffs 98, preferably four, are pressed into suitable openings in the rear face of front panel 26 so that standoffs 98 face inwardly toward the interior of housing 10 when panel 26 is in its closed position. A printed circuit board 100 is secured to standoffs 98 by respective mounting screws 102 and is spaced from the rear face of front panel 26 a distance sufficient to accommodate any circuit elements that are carried by circuit board 100 and that extend between the bottom of circuit board 100, as viewed in FIG. 3, and the rear face of front panel 26. Additionally, any rotary level controls, such as gain control 104 or the like, are carried on printed circuit board 100 in such a way that their shafts extend perpendicular to and through front panel 26 a sufficient distance that a suitable knob 36 can be attached to the ends of the shafts.

It can thus be seen that when front panel 26 is in the open position, as shown in FIG. 3, the circuit elements carried by printed circuit board 100 are accessible for inspection and servicing, as also is the interior of housing 10.

Referring once again to FIG. 2, the control circuit that is provided on printed circuit board 100 carried on the rear face of front panel 26 is connected with power transformer 22 by a suitable connector lead 106, and is connected with amplifier circuitry 24 by a multiple conductor ribbon connector 108, or the like.

When it is desired to close housing 10, front panel 26 is swung from the position illustrated in FIG. 3 so that it overlies the front of the housing, and the respective captive panel screws 32, which have both slotted and knurled ends, can be engaged with respective threaded apertures 30 in the panel connector flanges 28 to secure front panel 26 in the closed position.

The power supply portion of the circuitry within housing 10, including power transformer 22, can be connected to a suitable source of electric power by means of a power cord 110 that extends through rear panel 112 of housing 10 as illustrated in FIG. 4. Additionally, an auxiliary power outlet 114 for other operating other electrical devices can be provided, as well as a reset switch 116 and a grounding screw 118. Further, as also shown in FIG. 4, rear panel 112 can include a terminal strip 120 that provides a plurality of output connections of various power levels for connecting associated devices and circuits, if desired.

An important feature of the present invention is a shielded wire channel 122 that extends completely through housing 10 from rear panel 112 to front 26 panel as shown in FIGS. 1, 2, and 4 of the drawings. Wire channel 122 is provided by a generally U-shaped rectangular channel member that is suitably secured to the base panel in any convenient manner, as will be appreciated by those skilled in the art, and it defines a continuous duct that completely surrounds any conductor 124 that is positioned therein and is connected directly to the control circuit on the front panel to completely shield that conductor from stray magnetic fields generated by the power transformer or other interiorly-positioned components within the enclosure. Thus, any low level input signals can safely be provided directly to the control circuit on the front panel without the interference that such stray magnetic fields might ordinarily cause. Preferably, the U-shaped channel member is formed from the same material as the enclosure base, which can be, for example, eighteen gauge (0.0478 in.) cold rolled steel.

It therefore will be appreciated that the present invention as illustrated and described provides distinct advantages over the prior art structures in that it permits quick and easy interchangeability of various types of control circuit modules with a particular power module that can also include amplifier circuitry that is common to the respective control circuit modules. The respective modules are interchangeable, and permit a single housing 10 to provide different electrical functions to accommodate changing needs.

Although particular embodiments of the present invention have been illustrated and described, it will be apparent to those skilled in the art that various changes can be made without departing from the spirit of the present invention. It is therefore intended to encompass within the appended claims all such changes and modifications that fall within the scope of the present invention.

What is claimed is:

1. A modular housing for electronic apparatus, said housing comprising:

a. an enclosure having at least one open end, the enclosure housing a first electrical circuit including an electrical power supply circuit, and an electrical signal processing circuit for processing an electrical signal, the processing circuit operatively coupled with the power supply circuit and adapted to define a common first circuit to be coupled with and to provide power to any one of a plurality of second, control circuits to permit the apparatus to perform a desired predetermined function on an electrical signal, a first connector for electrically connecting the power supply circuit with a source of electric power;

b. a control panel including a second, control circuit carried on a printed circuit board supported by the control panel in a position substantially parallel with and spaced from an inner face of the control panel, the control circuit adapted to be coupled with the first circuit by a second connector for performing the desired predetermined function and including at least one manually operable control element carried by and facing outwardly from an outer face of the control panel, whereby the apparatus is converted from a first functional configuration to perform a first function to a second functional configuration to perform a second function different from the first function by retaining the common first circuit within the enclosure and replacing a control panel with another control panel to enable the apparatus to perform a different function determined by the control circuit carried by the respective control panel;

c. mounting means for pivotally mounting the control panel on the enclosure to permit the control panel to be movable relative to the enclosure from a first position at which the control panel overlies and closes the open end of the enclosure, to a second position at which the control panel is pivoted away from the open end of the enclosure to permit access to the control circuit on the inner face of the control panel and to permit access to the interior of the enclosure; and d. wire channel means positioned interiorly of the enclosure and extending from the open end to which the control panel is connected to an opposite end of the enclosure, the wire channel means providing a shielded channel for shielding from the power supply circuit an input signal conductro means connectable with the control circuit.

2. A housing as claimed in claim 1 wherein the enclosure has a rectangular cross section.

3. A housing as claimed in claim 1 wherein the control panel has a rectangular cross section and a size to permit the control panel to fit within and to close the rectangular opening in the enclosure.

4. A housing as claimed in claim 1 including standoff means extending from the inner face of the control panel to space the printed circuit board from the control panel inner face.

5. A housing as claimed in claim 1 wherein the mounting means includes a hinge positioned adjacent an edge of the control panel for pivotally supporting the control panel relative to the enclosure.

6. A housing as claimed in claim 5 wherein the enclosure includes a base and the hinge is connected with and extends along an edge of the enclosure base at the enclosure open end and is connected with and extends along an edge of the control panel.

7. A housing as claimed in claim 6 including releasable connection means carried by the control panel for connection with the enclosure to securely and releasably hold the control panel in a closed position relative to the enclosure.

8. A modular housing for electronic apparatus, said housing comprising:
   a. a hollow structure having a pair of opposed side walls, a back wall, and a top and bottom wall each connected along edge of the side walls and of the back wall to define a rectangular enclosure having an open end, an electrical power supply circuit including a power transformer positioned within the enclosure, an amplifier circuit positioned within the enclosure for amplifying an electrical signal, the amplifier circuit operatively coupled with the power supply circuit and adapted to be coupled with and to be a common first circuit to provide power to any one of a plurality of second, control circuits to permit the apparatus to perform a selected one of a plurality of desired predetermined function on an electrical signal, and first connector means for electrically connecting the power supply circuit with a source of electric power;
   b. a rectangular control panel having a size to permit it to fit in the opening in the enclosure and including a control circuit carried on a printed circuit board supported by the control panel in a position substantially parallel with and spaced inwardly from an inner face of the control panel, the control circuit including manually adjustable control elements including at least one of switch means, indicator means, and signal level control means manually operable from an outer face of the control panel, the control panel hingedly connected with the enclosure base along a lower edge thereof for pivotal movement of the control panel between a first position at which the control panel overlied the enclosure open end to close the enclosure open end and a second position at which the control panel is pivotally spaced from the enclosure open end to provide access to the interior of the enclosure through the enclosure opening and to provide access to the control circuit;
   c. whereby a plurality of individual modular control panels each carrying a different control circuit can be individually selectively and interchangeably pivotally mounted to the enclosure to enable the electronic apparatus to perform different functions dependent upon the control circuit selected and using the same enclosure with the same first circuit.

9. A modular housing as claimed in claim 8 including a wire channel extending within the enclosure from the rear panel thereof to the control panel to provide an enclosed wireway for shielding a conductor positioned within the wireway.

* * * * *